(12) United States Patent
Lee

(10) Patent No.: US 7,969,795 B2
(45) Date of Patent: Jun. 28, 2011

(54) NEGATIVE VOLTAGE GENERATOR FOR USE IN SEMICONDUCTOR MEMORY DEVICE

(75) Inventor: Kang-Seol Lee, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 93 days.

(21) Appl. No.: 11/819,786

(22) Filed: Jun. 29, 2007

(65) Prior Publication Data

US 2008/0159043 A1      Jul. 3, 2008

(30) Foreign Application Priority Data

Jan. 3, 2007 (KR) .................. 10-2007-0000407

(51) Int. Cl.
*G11C 5/14* (2006.01)
*G11C 7/04* (2006.01)

(52) U.S. Cl. ............ 365/189.09; 365/211; 365/226

(58) Field of Classification Search ............ 365/226, 365/189.09, 211, 212; 327/536, 538; 702/136
See application file for complete search history.

(56) References Cited

U.S. PATENT DOCUMENTS

| | | | | |
|---|---|---|---|---|
| 4,142,114 | A * | 2/1979 | Green ..................... | 327/536 |
| 5,553,295 | A * | 9/1996 | Pantelakis et al. ........... | 365/226 |
| 5,673,232 | A * | 9/1997 | Furutani .................. | 365/226 |
| 6,055,186 | A * | 4/2000 | Hung et al. ............... | 365/226 |
| 6,335,893 | B1 * | 1/2002 | Tanaka et al. .............. | 365/226 |
| 6,928,007 | B2 | 8/2005 | Jin | |
| 6,980,020 | B2 | 12/2005 | Best et al. | |
| 7,009,904 | B2 | 3/2006 | Kim | |
| 7,019,555 | B2 | 3/2006 | Lee | |
| 7,043,565 | B1 | 4/2006 | Lee | |
| 7,064,989 | B2 | 6/2006 | Na et al. | |
| 7,170,810 | B1 * | 1/2007 | O et al. ................... | 365/226 |
| 7,187,612 | B2 * | 3/2007 | Seitz ..................... | 365/226 |
| 7,266,031 | B2 * | 9/2007 | Kim et al. ................. | 365/226 |
| 7,298,199 | B2 * | 11/2007 | Jung et al. ................ | 327/536 |
| 7,366,048 | B2 * | 4/2008 | Byeon .................... | 365/226 |
| 7,454,586 | B2 * | 11/2008 | Shi et al. ................. | 365/212 |
| 7,454,640 | B1 * | 11/2008 | Wong ..................... | 327/538 |
| 7,609,195 | B2 * | 10/2009 | Jeong .................... | 365/211 |

(Continued)

FOREIGN PATENT DOCUMENTS

JP         2004-310981         11/2004

(Continued)

OTHER PUBLICATIONS

Korean Office Action, with English Translation, issued in Korean Patent Application No. KR 10-2007-0000407, issued on Jan. 28, 2008.

(Continued)

*Primary Examiner* — Trong Phan
(74) *Attorney, Agent, or Firm* — IP & T Group LLP

(57) ABSTRACT

A negative voltage generator of a semiconductor memory device includes: a flag signal generation unit for receiving a temperature information code from an On Die Thermal Sensor (ODTS) to output a plurality of flag signals containing temperature information of the semiconductor memory device; and a negative voltage detection unit for detecting a negative voltage to output a detection signal for determining whether to pump a negative voltage, wherein a detection level of the negative voltage is changed according to the flag signals.

20 Claims, 6 Drawing Sheets

U.S. PATENT DOCUMENTS

| | | | | |
|---|---|---|---|---|
| 7,610,165 B2 * | 10/2009 | Jeong et al. | | 327/538 |
| 7,733,730 B2 * | 6/2010 | Hashiba | | 365/211 |
| 7,876,636 B2 * | 1/2011 | Jeong et al. | | 365/211 |
| 2008/0082291 A1 * | 4/2008 | Jeong et al. | | |

FOREIGN PATENT DOCUMENTS

| | | |
|---|---|---|
| JP | 2005-228458 | 8/2005 |
| KR | 10-2006-66215 | 6/2006 |
| KR | 10-2007-0019066 A | 2/2007 |

OTHER PUBLICATIONS

Korean Notice of Preliminary Rejection, with partial English translation, issued in Korean Patent Application No. 10-2007-0000407 dated on Jul. 18, 2008.

Korean Notice of Allowance, w/ English translation thereof, Issued in Korean Patent Application No. KR 10-2007-0000407 dated Jan. 9, 2009.

* cited by examiner

NEGATIVE VOLTAGE GENERATOR FOR USE IN SEMICONDUCTOR MEMORY DEVICE

CROSS-REFERENCE TO RELATED APPLICATIONS

The present invention claims priority of Korean patent application number 10-2007-0000407, filed on Jan. 3, 2007, which is incorporated by reference in its entirety.

BACKGROUND OF THE INVENTION

The present invention relates to a semiconductor memory device, and more particularly, to a negative voltage generator for generating a negative voltage lower than a ground voltage in a semiconductor memory device.

A semiconductor memory device needs a negative voltage in order to use a negative word line driving scheme. According to the negative word line driving scheme, a word line driver enables a word line by supplying a high voltage (VPP) to the word line and disables the word line by supplying a negative voltage (VBBW) lower than a ground voltage (VSS) to the word line.

In other words, while the ground voltage (VSS) is generally supplied to the word line in order to disable the word line, the negative word line driving scheme supplies the negative voltage (VBBW) lower than the ground voltage (VSS) to the word line in order to disable the word line.

The negative word line driving scheme can improve refresh characteristic and other AC parameters. Specifically, if the word line is disabled using the negative voltage (VBBW) lower than the ground voltage (VSS), retention time of a cell increases, resulting in an increase of a refresh period. In addition, when a low power supply voltage (VCC) is used, a VPP burden of supplying the high voltage (VPP) can be reduced and a write recovery time (TWR) can be improved.

SUMMARY OF THE INVENTION

Embodiments of the present invention are directed to providing a negative voltage generator for generating a negative voltage VBBW having a different level depending on temperature.

In accordance with an aspect of the present invention, there is provided a negative voltage generator of a semiconductor memory device, including: a flag signal generation unit for receiving a temperature information code from an On Die Thermal Sensor (ODTS) to output a plurality of flag signals containing temperature information of the semiconductor memory device; and a negative voltage detection unit for detecting a negative voltage to output a detection signal for determining whether to pump a negative voltage, wherein a detection level of the negative voltage is changed according to the flag signals.

In accordance with another aspect of the present invention, there is provided a negative voltage generator of a semiconductor memory device, including: a temperature information providing unit for providing temperature information of the semiconductor memory device; and a pumping unit for pumping a negative voltage having a different level depending on temperature by using the temperature information.

DESCRIPTION OF SPECIFIC EMBODIMENTS

Hereinafter, a negative voltage generator for generating a negative voltage lower than a ground voltage in a semiconductor memory device in accordance with exemplary embodiments of the present invention will be described in detail with reference to the accompanying drawings.

Figure 1:
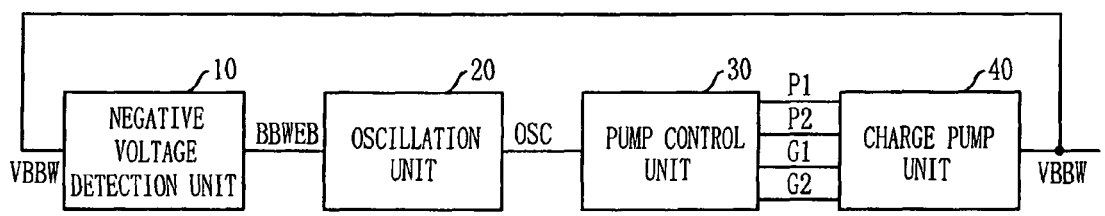
FIG. 1 is a block diagram of a negative voltage generator in accordance with a first embodiment of the present invention.

FIG. 1 is a block diagram of a negative voltage generator in accordance with a first embodiment of the present invention.

Referring to FIG. 1, the negative voltage generator includes a negative voltage detection unit 10, an oscillation unit 20, a pump control unit 30, and a charge pump unit 40.

The negative voltage detection unit 10 detects a level of a negative voltage VBBW and outputs a detection signal BBWEB for determining whether the charge pump unit 40 operates or not. The oscillation unit 20 receives the detection signal BBWEB to output a periodic signal OSC. The pump control unit 30 outputs a plurality of pump control signals P1, P2, G1 and G2 in response to the periodic signal OSC. The charge pump unit 40 pumps the negative voltage VBBW in response to the pump control signals P1, P2, G1 and G2.

When the negative voltage VBBW detected by the negative voltage detection unit 10 is sufficiently low, the charge pump unit 40 stops pumping the negative voltage VBBW. When the negative voltage VBBW detected by the negative voltage detection unit 10 is high, the charge pump unit 40 pumps the negative voltage VBBW.

Figure 2:
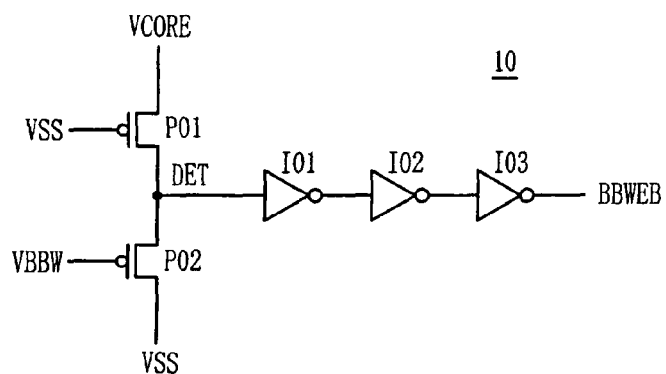
FIG. 2 is a circuit diagram of a negative voltage detection unit shown in FIG. 1.

FIG. 2 is a circuit diagram of the negative voltage detection unit 10 shown in FIG. 1.

Referring to FIG. 2, a ground voltage VSS and a negative voltage VBBW are applied to a gate of a first PMOS transistor P01 and a gate of a second PMOS transistor P02, respectively. The first and second PMOS transistors P01 and P02 operate in a linear region and act as a resistor to divide a high voltage VCORE and the ground voltage VSS. For example, when an absolute value of the negative voltage VBBW is low (it means that the negative voltage VBBW itself is high) so that a resistance of the second PMOS transistor P02 is large, a voltage level of a node DET increases. Consequently, inverters I01~I03 output the detection signal BBWEB as a logic low level. On the other hand, when the absolute value of the negative voltage VBBW is high so that a resistance of the second PMOS transistor P02 is small, the voltage level of the node DET decreases. Consequently, the inverters I01~I03 output the detection signal BBWEB as a logic high level.

In this way, the negative voltage detection unit 10 detects the level of the negative voltage VBBW, which is produced through the voltage division of the first and second PMOS transistors P01 and P02 receiving the ground voltage VSS and the negative voltage VBBW.

Figure 3:
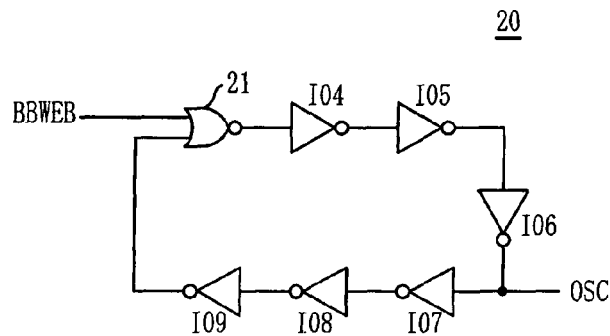
FIG. 3 is a circuit diagram of an oscillation unit shown in FIG. 1.

FIG. 3 is a circuit diagram of the oscillation unit 20 shown in FIG. 1.

Referring to FIG. 3, the oscillation unit 20 is implemented with a ring oscillator. The ring oscillator includes a NOR gate 21 receiving the detection signal BBWEB and a plurality of inverters I04 to I09.

When the detection signal BBWEB of a high level is inputted to the NOR gate 21, the NOR gate 21 always outputs a low signal. When the detection signal BBWEB of a low level is inputted to the NOR gate 21, the NOR gate 21 acts as an inverter. Thus, the periodic signal OSC is outputted through the inverters I04 to I09 connected in a ring shape.

Figure 4:
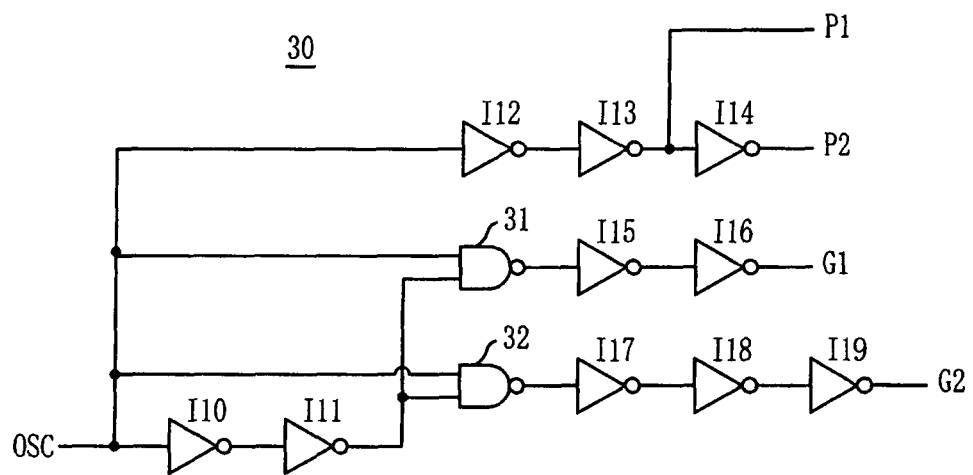
FIG. 4 is a circuit diagram of a pump control unit shown in FIG. 1.
Figure 5:
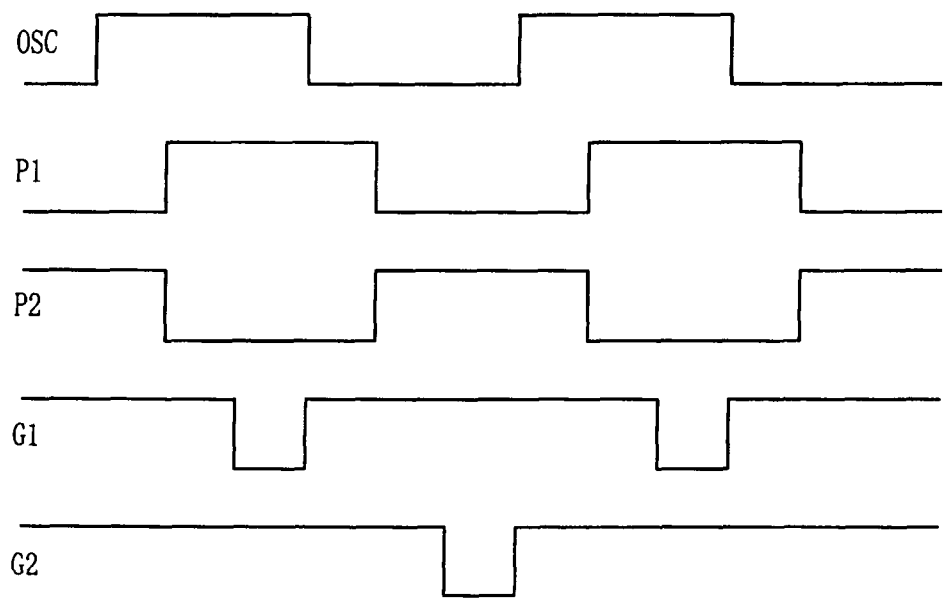
FIG. 5 is a timing diagram of the pump control unit shown in FIG. 1.

FIG. 4 is a circuit diagram of the pump control unit 30 shown in FIG. 1, and FIG. 5 is a timing diagram of the pump control unit 30 shown in FIG. 1.

Referring to FIGS. 4 and 5, the pump control unit 30 includes first and second NAND gates 31 and 32 and a plurality of inverters I10 to I19. The pump control unit 30 outputs the plurality of pump control signals P1, P2, G1 and G2. The first and second pump control signals P1 and P2 enable the charge pump unit 40 to perform the pumping operation, and the third and fourth pump control signals G1 and G2 are precharge signals.

Figure 6:
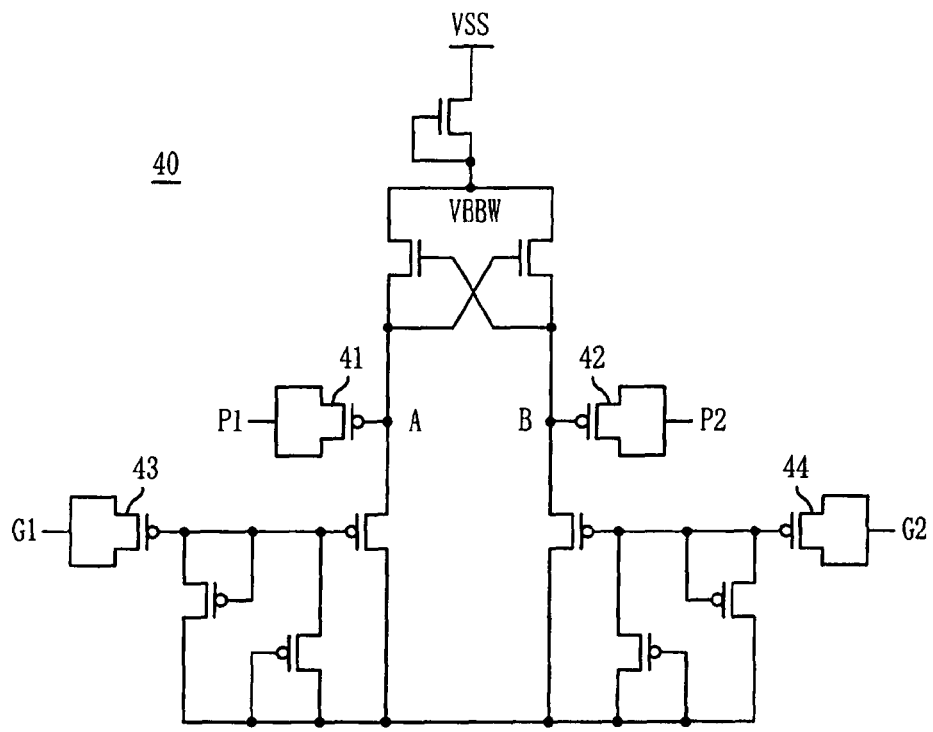
FIG. 6 is a circuit diagram of a charge pump unit 40 shown in FIG. 1.

FIG. 6 is a circuit diagram of the charge pump unit 40 shown in FIG. 1.

The charge pump unit 40 generates the negative voltage VBBW. The charge pump unit 40 includes first to fourth PMOS transistors 41, 42, 43 and 44 acting as capacitors. That is, sources and drains of the first to fourth PMOS transistors 41, 42, 43 and 44 are connected to each other and receive the pump control signals P1, P2, G1 and G2, respectively.

Upon operation, the charge pump unit 40 pumps the negative voltage VBBW in response to the pump control signals P1 and P2 and precharges the voltage levels of nodes A and B to the ground voltage VSS in response to the pump control signals G1 and G2.

As described above, the negative voltage generator generates the negative voltage VBBW, and the negative word line driving is performed using the negative voltage VBBW as a word line disable voltage, that is, a voltage for turning off a cell transistor.

The increase of temperature causes the increase of leakage current in the cell transistor. Therefore, the negative voltage VBBW must be greatly low at high temperature. However, the negative voltage VBBW need not be greatly low at room temperature or low temperature. Because the negative voltage generator generates the constant negative voltage VBBW regardless of temperature, the semiconductor memory device unnecessarily consumes a large amount of a current in pumping the negative voltage VBBW at room temperature or low temperature.

Figure 7:
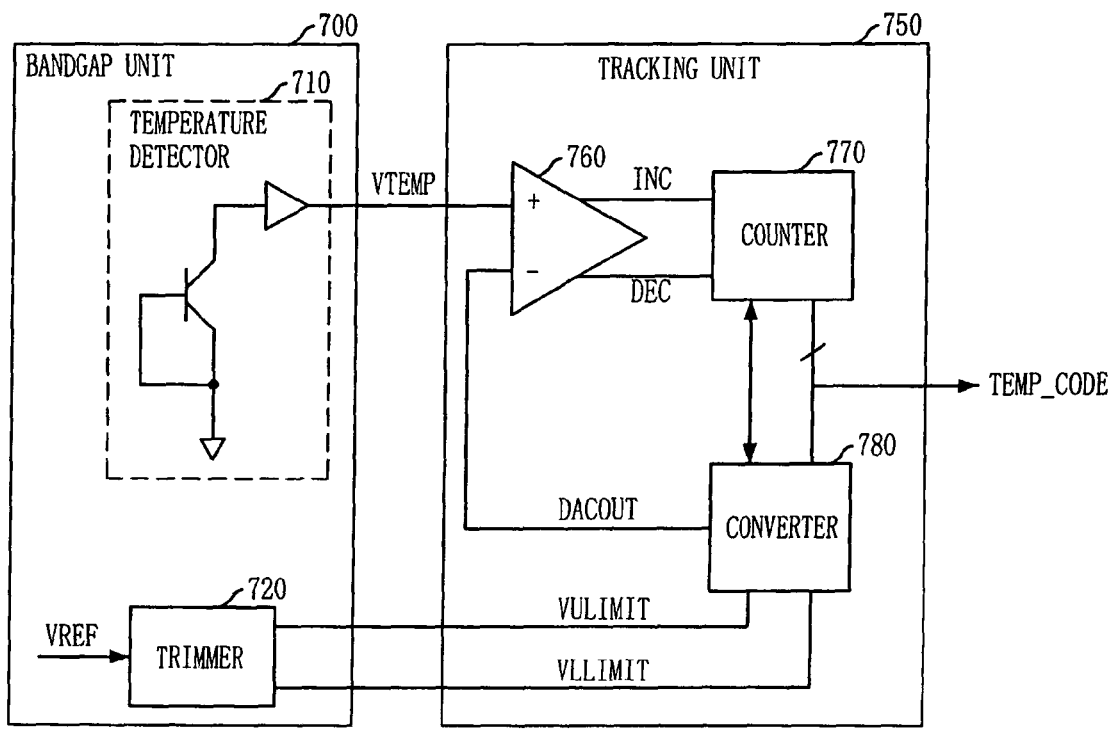
FIG. 7 is a block diagram of a On Die Thermal Sensor.

FIG. 7 is a block diagram of an On Die Thermal Sensor (ODTS).

In the present invention, an ODTS is used to obtain temperature information. The ODTS will be briefly described below.

The ODTS is widely used to control a refresh period in a semiconductor memory device.

One of many attempts to reduce power consumption in the refresh operation is to change a refresh period according to temperature. As the temperature becomes lower, the data retention time in a dynamic random access memory (DRAM) becomes longer. Based on this characteristic, the power consumption can be reduced by dividing a temperature range into a plurality of sub-ranges and relatively reducing a refresh clock frequency at a low-temperature range. Therefore, the ODTS has been used to correctly detect the internal temperature of the DRAM and output information about the detected temperature.

Referring to FIG. 7, the ODTS includes a bandgap unit 700 and a tracking unit 750. Also, the bandgap unit 700 includes a temperature detector 710 and a trimmer 720, and the tracking unit 750 includes a voltage comparator 760, a counter 770, and a converter 780.

Specifically, the temperature detector 710 detects a temperature of the semiconductor memory device using the fact that a base-emitter voltage (VBE) change of a bipolar junction transistor (BJT) is about $-1.8$ mV/° C. in a bandgap circuit, which is not influenced by the change of temperature or a power supply voltage of the semiconductor memory device. The temperature detector 710 outputs a first voltage VTEMP corresponding to the temperature by 1:1 by amplifying the finely changing base-emitter voltage (VBE) of the BJT. That is, as the temperature of the semiconductor memory device becomes higher, the temperature detector 710 outputs a lower base-emitter voltage (VBE) of the BJT.

The converter 780 is implemented with a digital-to-analog converter (DAC). The converter 780 outputs a second voltage DACOUT in response to a temperature information code TEMP_CODE. The second voltage DACOUT is an analog voltage and the temperature information code TEMP_CODE is a digital value outputted from the counter 770. The second voltage DACOUT is determined by an upper limit voltage VULIMIT and a lower limit voltage VLLIMIT outputted from the trimmer 720.

The voltage comparator 760 compares the first voltage VTEMP with the second voltage DACOUT. When the first voltage VTEMP is lower than the second voltage DACOUT, the voltage comparator 760 outputs a decrement signal DEC to cause the counter 770 to decrease a preset digital code. On the other hand, when the first voltage VTEMP is higher than the second voltage DACOUT, the voltage comparator 760 outputs an increment signal INC to cause the counter 770 to increase the preset digital code.

In addition, the counter 770 increases or decreases the preset digital code in response to the increment signal INC or the decrement signal DEC outputted from the voltage comparator 760, and outputs the temperature information code TEMP_CODE containing temperature information.

The trimmer 720 receives a reference voltage VREF from the bandgap circuit that is not influenced by the change of the temperature or the power supply voltage of the semiconductor memory device, and outputs the upper limit voltage VULIMIT and the lower limit voltage VLLIMIT that are not influenced by the change of the temperature or the power supply voltage of the semiconductor memory device. In the manufacturing process of the semiconductor memory device, the range of the base-emitter voltage (VBE) of the BJT with respect to the temperature is different in each die. Therefore, the potential level of the reference voltage VREF is previously set through an external circuit in order to increase the accuracy of a temperature compensation. The upper limit voltage VULIMIT has a constant voltage difference from the lower limit voltage VLLIMIT.

Through the operation of the bandgap unit 700 and the tracking unit 750, the second voltage DACOUT tracks the first voltage VTEMP and then the digital code stored in the counter 22 is outputted as the temperature information code TEMP_CODE representing current temperature information.

Generally, the temperature information code TEMP_CODE containing the temperature information outputted from the ODTS is converted into flag signals representing the temperature information by a flag signal generator, and the refresh period is controlled using the flag signals. This operation will be described later.

Figure 8:
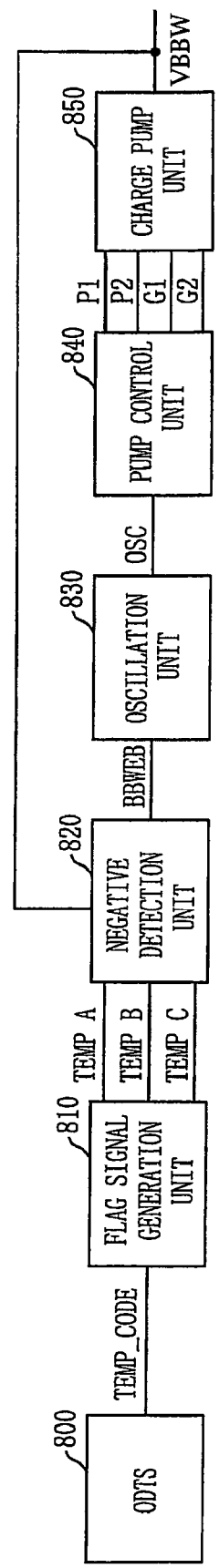
FIG. 8 is a block diagram of a negative voltage generator of a semiconductor memory device in accordance with a second embodiment of the present invention.

FIG. 8 is a block diagram of a negative voltage generator of a semiconductor memory device in accordance with a second embodiment of the present invention.

Referring to FIG. 8, the negative voltage generator in accordance with the second embodiment of the present invention includes a flag signal generation unit 810 and a negative voltage detection unit 820. The flag signal generation unit 810 receives a temperature information code TEMP_CODE from an ODTS 800 to output first to third flag signals TEMPA, TEMPB and TEMPC containing temperature information of the semiconductor memory device. The negative voltage detection unit 820 detects a negative voltage VBBW to output a detection signal BBWEB. In the negative voltage detection unit 820, detection levels of the negative voltage VBBW vary according to the first to third flag signals TEMPA, TEMPB and TEMPC. Accordingly, the negative voltage generator generates the negative voltage VBBW having different levels depending on temperature.

In detail, the flag signal generation unit 810 receives the temperature information code TEMP_CODE containing the temperature information of the semiconductor memory device from the ODTS 800 and generates the first to third flag signals TEMPA, TEMPB and TEMPC containing the temperature information. The first to third flag signals TEMPA, TEMPB and TEMPC are outputted differently depending on the temperature range of the semiconductor memory device.

For example, when the temperature of the semiconductor memory device is lower than a first reference temperature A, all of the first to third flag signals TEMPA, TEMPB and TEMPC have a low level. When the temperature of the semiconductor memory device is in a range between the first reference temperature A and a second reference temperature B having a value higher than that of the first reference temperature A, the first to third flag signals TEMPA, TEMPB and TEMPC have a high level, a low level, and a low level, respectively. When the temperature of the semiconductor memory device is in a range between the second reference temperature B and a reference temperature C having a value higher than that of the second reference temperature B, the first to third flag signals TEMPA, TEMPB and TEMPC have a high level, a high level, and a low level, respectively. In addition, when the temperature of the semiconductor memory device is higher than a third reference temperature C, all of the first to third flag signals TEMPA, TEMPB and TEMPC have a high level. That is, as the temperature increases, the number of the flag signals having the high level increases.

The flag signal generation unit 810 generates the first to third flag signals TEMPA, TEMPB and TEMPC using the temperature information code TEMP_CODE output from the ODTS 800. The flag signal generation unit 810 has been used in the existing semiconductor memory device to control the refresh period in each temperature range using the temperature information. Since it is apparent to those skilled in the art that the first to third flag signals TEMPA, TEMPB and TEMPC are generated by decoding the temperature information code TEMP_CODE outputted from the ODTS 800, its detailed description will be omitted.

In addition, although the flag signal generation unit 810 is provided outside the ODTS 800 in FIG. 8, it can also be provided inside the ODTS 800.

The negative voltage detection unit 820 detects the negative voltage VBBW to output the detection signal BBWEB for determining whether to pump the negative voltage VBBW. The detection level of the negative voltage VBBW changes depending on logic levels of the first to third flag signals TEMPA, TEMPB and TEMPC. Specifically, when the temperature of the semiconductor memory device is high, the detection level of the negative voltage VBBW decreases. When the temperature of the semiconductor memory device is low, the detection level of the negative voltage VBBW increases.

Whether to pump the negative voltage VBBW is determined depending on the logic level of the detection signal BBWEB outputted from the negative voltage detection unit 820. That is, when the detection signal BBWEB is high, a charge pump unit 850 pumps the negative voltage VBBW. When the detection signal BBWEB is low, the charge pump unit 850 stops pumping the negative voltage VBBW.

In the negative voltage detection unit shown in the first embodiment of the present invention, the level of the negative voltage VBBW that changes the detection signal BBWEB from a high level to a low level or from a low level to a high level is constant regardless of temperature. However, in the negative voltage detection unit 820 shown in the second embodiment of the present invention, the level of the negative voltage VBBW that changes the detection signal BBWEB is different depending on temperature. Therefore, the negative voltage VBBW is pumped at high temperature in order to have a lower value, and the negative voltage VBBW is pumped at low temperature in order to have a higher value. In this way, the current consumption can be reduced.

An oscillation unit 830 receives the detection signal BBWEB to output a periodic signal OSC. A pump control unit 840 outputs pump control signals P1, P2, G1 and G2 in response to the periodic signal OSC. The charge pump unit 850 generates the negative voltage VBBW in response to the pump control signals P1, P2, G1 and G2. The oscillator unit 830, the pump control unit 840, and the charge pump unit 850 can be implemented with the same structures as those of the first embodiment of the present invention. In some cases, the oscillator unit 830 can be designed to directly control the charge pump unit 850, without using the pump control unit 840.

In this embodiment, a temperature information providing unit is implemented with the ODTS 800 and the flag signal generation unit 810. Using the temperature information from the temperature information providing unit, the negative voltage is pumped at different detection levels depending on temperature. A basic spirit of the present invention is to generate the negative voltages having different levels depending on temperature by using the temperature information. As another embodiment, instead of the detection level of the negative voltage, the pumping level of the negative voltage can change using the temperature information outputted from the temperature information providing unit.

Figure 9:
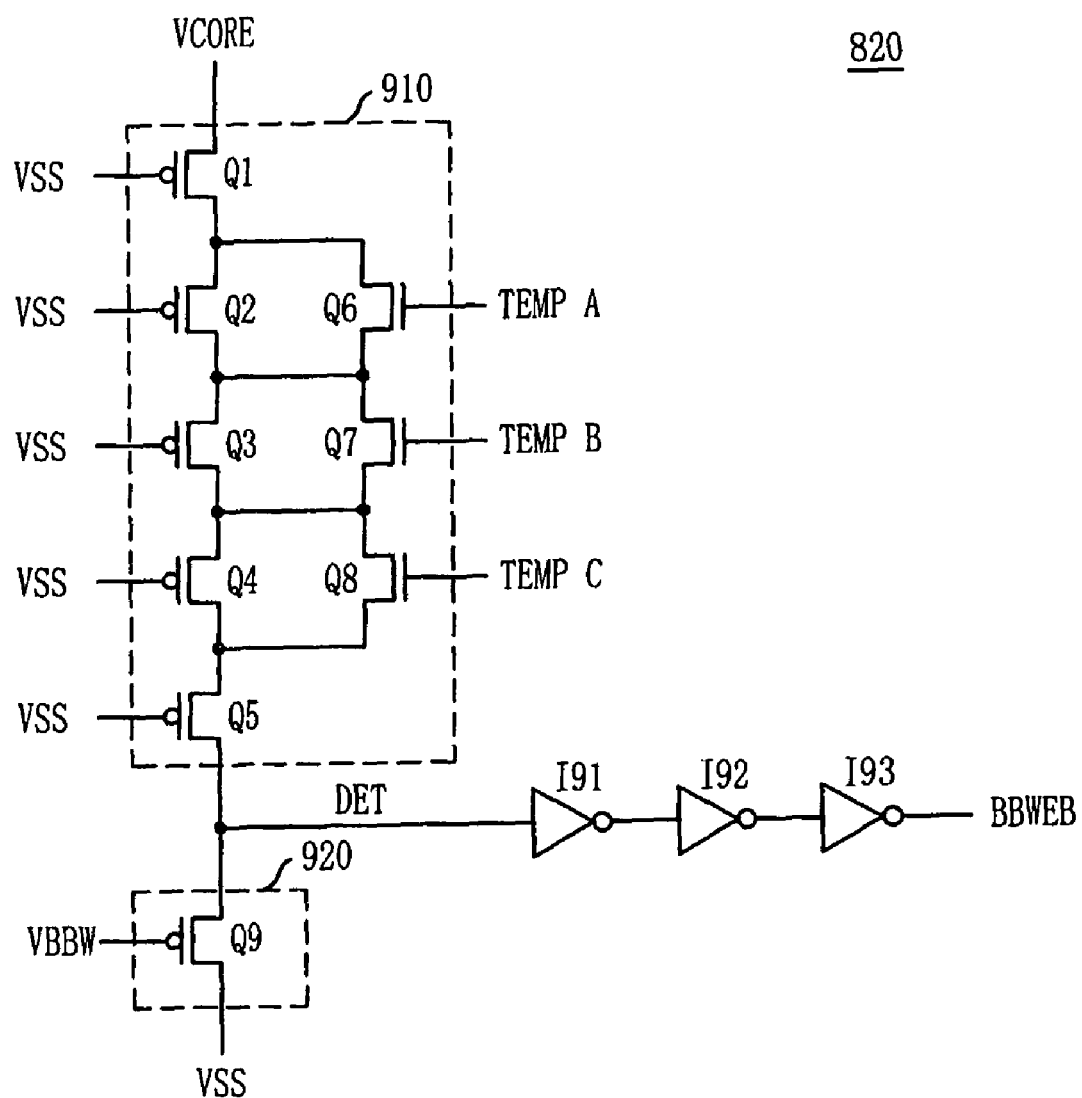
FIG. 9 is a circuit diagram of a negative voltage detection unit shown in FIG. 8.

FIG. 9 is a circuit diagram of the negative voltage detection unit 820 shown in FIG. 8.

Referring to FIG. 9, the negative voltage detection unit 820 includes a first resistive block 910 and a second resistive block 920. The first resistive block 910 has a resistance varying according to the control of a ground voltage VSS and connects a first node DET to a high voltage VCORE. The second resistive block 920 has a resistance varying according to the control of the negative voltage VBBW and connects the first node DET to the ground voltage VSS. The negative voltage detection unit 820 detects the negative voltage VBBW using the voltage level of the first node DET, which is divided by the first and second resistive blocks 910 and 920. The resistance of the first resistive block 910 or the second resistive block 920 is also changed by the first to third flag signals TEMPA, TEMPB and TEMPC.

In detail, the first resistive block 910 includes a plurality of PMOS transistors Q1, Q2, Q3, Q4 and Q5 and a plurality of NMOS transistors Q6, Q7 and Q8. The PMOS transistors Q1, Q2, Q3, Q4 and Q5 are connected in series and have gates receiving the ground voltage VSS. The NMOS transistors Q6, Q7 and Q8 have gates receiving the first to third flag signals TEMPA, TEMPB and TEMPC, respectively. The NMOS transistors Q6, Q7 and Q8 are opened or shorted in response to the first to third flag signals TEMPA, TEMPB and TEMPC to change the resistance of the first resistive block 910 depending on temperature.

The second resistive block 920 includes a PMOS transistor Q9 having a gate receiving the negative voltage VBBW and a drain-source path connecting the first node DET to the ground voltage VSS.

The negative voltage generation unit 820 further includes a plurality of inverters I91, I92 and I93 connected in series to the first node DET. The inverters I91, I92 and I93 output the detection signal BBWEB according to the detection level of the first node DET.

Upon operation, the first resistive block 910 and the second resistive block 920 divide the high voltage VCORE and the ground voltage VSS so that the divided voltage appears at the first node DET. The voltage level of the first node DET is changed depending on the temperature because the resistance of the first resistive block 910 is changed by the first to third flag signals TEMPA, TEMPB and TEMPC containing the temperature information. Although the core voltage VCORE and the ground voltage VSS are used as the high voltage and the low voltage, other voltages can also be used.

That is, as the temperature increases, the resistance of the first resistive block 910 decreases and thus the voltage level of the first node DET increases. At this point, when the negative voltage VBBW is much lower and the resistance of the second resistive block 920 is much smaller, the detection signal BBWEB of a high level is outputted and the charge pump unit 850 stops the pumping operation.

In this way, the negative voltage generator shown in FIG. 8 generates the negative voltage VBBW having a lower voltage level at high temperature and a higher voltage level at low temperature.

The negative voltage detection unit 820 shown in FIG. 9 is designed such that the first resistive block 910 has smaller resistance as the temperature increases. Meanwhile, the object of the present invention can also be achieved by designing the negative voltage detection unit 820 such that the second resistive block 920 has larger resistance as the temperature increases. In this case, the negative voltage detection unit 820 includes a plurality of PMOS transistors acting as a resistor and a plurality of NMOS transistors that are opened according to temperature in such a way that more NMOS transistors are opened in response to the first to third flag signals TEMPA, TEMPB and TEMPC as the temperature increase. To this end, the negative voltage detection unit 820 is designed such that more flag signals TEMPA, TEMPB and TEMPC have a low level as the temperature increases. Alternatively, the negative voltage detection unit 820 is designed such that it receives the existing flag signals inverted by inverters.

Therefore, only the resistance of the resistive block 910 is not necessarily changed by the first to third flag signals TEMPA, TEMPB and TEMPC. The resistance of one of the first and second resistive blocks 910 and 920 has only to be changed by the first to third flag signals TEMPA, TEMPB and TEMPC.

Figure 10:
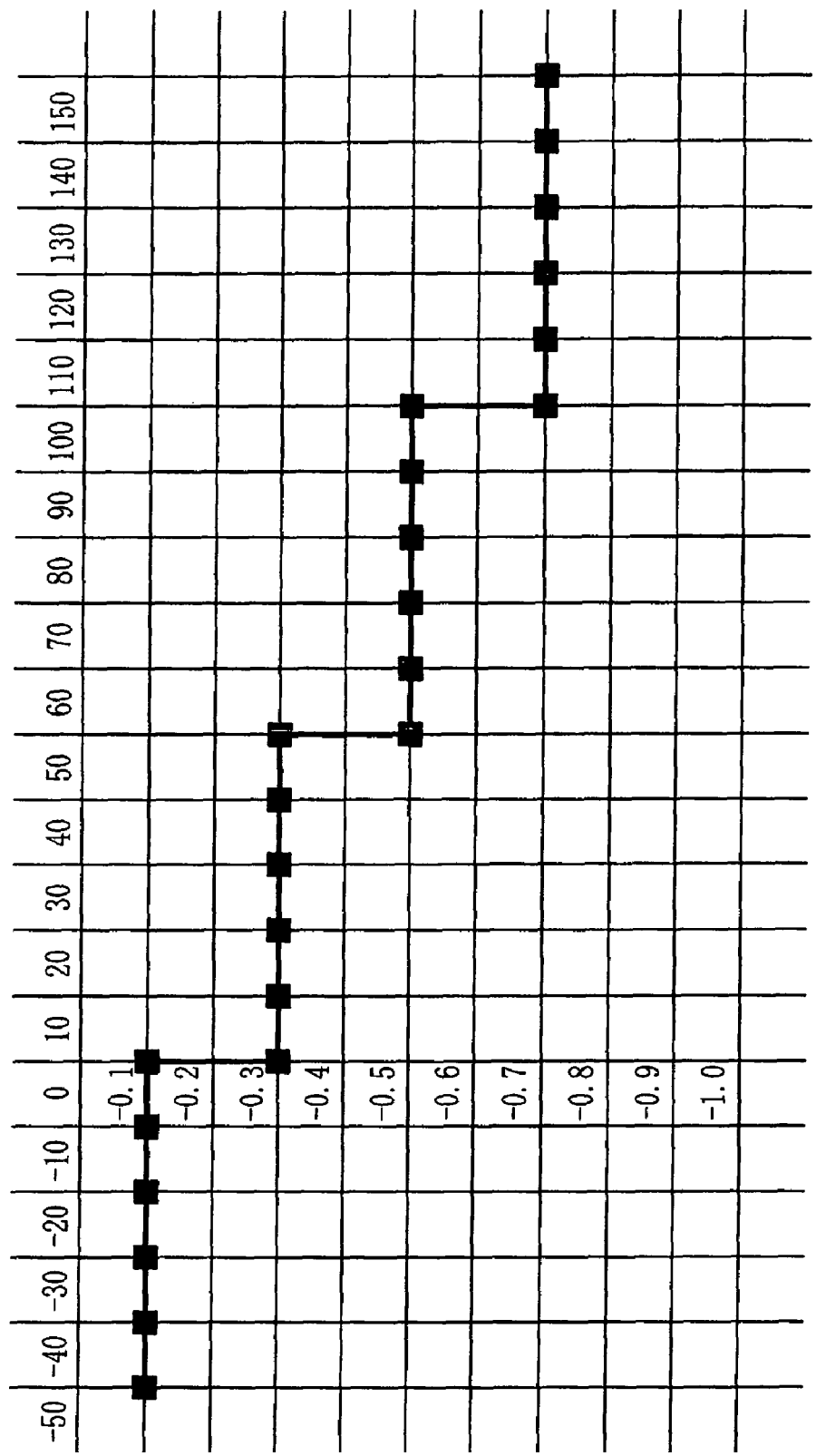
FIG. 10 is a graph showing levels of a negative voltage generated according to temperature in the negative voltage generator of FIG. 8.

FIG. 10 is a graph showing the negative voltage having different levels depending on the temperature in the negative voltage generator 820 of FIG. 8.

The negative voltage VBBW is −0.1V when the temperature in the negative voltage generator 820 is −50~0° C., −0.3V when the temperature is 0~50° C., −0.5V when the temperature is 50~100° C., and −0.7V when the temperature is 100~150° C. It can be seen from FIG. 10 that the negative voltage generator generates the negative voltage having a lower level as the temperature increases.

As described above, the negative voltage generator of the semiconductor memory device in accordance with the present invention generates a sufficiently low negative voltage as the temperature increases, thereby reducing the leakage current of the cell transistor. In addition, when the temperature is low, the negative voltage generator generates the negative voltage higher than that at the high temperature, thereby reducing the current consumption.

While the present invention has been described with respect to the specific embodiments, it will be apparent to those skilled in the art that various changes and modifications may be made without departing from the spirit and scope of the invention as defined in the following claims.

What is claimed is:

1. A negative voltage generator of a semiconductor memory device, comprising:
    a flag signal generation unit configured to receive a temperature information code from an On Die Thermal Sensor (ODTS) to generate a plurality of flag signals that include temperature information of the semiconductor memory device by decoding the temperature information code and to output the plurality of flag signals including the temperature information of the semiconductor memory device; and
    a negative voltage detection unit configured to receive the plurality of flag signals including the temperature information and to detect a negative voltage to generate a detection signal, used in generating the negative voltage, for determining whether to change the negative voltage, wherein a detection level of the negative voltage varies depending on the plurality of flag signals including the temperature information, wherein the negative voltage is a lower voltage than a ground voltage,
    wherein the negative voltage detection unit comprises:
        a first resistive block having resistance changing according to the ground voltage, wherein the first resistive block couples a first node to a core voltage of the semiconductor memory device; and
        a second resistive block having resistance changing according to the negative voltage, wherein the second resistive block couples the first node to the ground voltage.

2. The negative voltage generator as recited in claim 1, wherein the negative voltage detection unit decreases the detection level of the negative voltage when temperature of the semiconductor memory device is high, and increases the detection level of the negative voltage when the temperature of the semiconductor memory device is low.

3. The negative voltage generator as recited in claim 2, wherein the negative voltage detection unit detects the negative voltage using a divided voltage produced by dividing a voltage level of the first node with the first resistive block and the second resistive block, the resistance of the first resistive block or the second resistive block changing according to the flag signals.

4. The negative voltage generator as recited in claim 3, wherein the first resistive block comprises a plurality of serially-connected PMOS transistors each of which receives the ground voltage through a gate thereof, the plurality of PMOS transistors being opened or shorted in response to the plurality of flag signals.

5. The negative voltage generator as recited in claim 4, wherein the PMOS transistors are opened or shorted by a plurality of NMOS transistors, each NMOS transistor having a gate receiving a corresponding one of the flag signals, a drain connected to a source of a corresponding one of the PMOS transistors, and a source connected to a drain of a corresponding one of the PMOS transistors.

6. The negative voltage generator as recited in claim 3, wherein the second resistive block comprises a PMOS transistor receiving the negative voltage through a gate thereof and connecting the first node to the ground voltage through a drain-source path.

7. The negative voltage generator as recited in claim 3, wherein the negative voltage detection unit further comprises a plurality of inverters connected in series to the first node to output the detection signal.

8. The negative voltage generator as recited in claim 1, further comprising:
   an oscillation unit configured to receive the detection signal and to output a periodic signal;
   a pump control unit configured to receive the periodic signal and to output a plurality of pump control signals in response to the periodic signal; and
   a charge pump unit configured to receive the plurality of pump control signals and to generate the negative voltage in response to the plurality of pump control signals.

9. The negative voltage generator as recited in claim 8, wherein the oscillation unit includes a ring oscillator.

10. The negative voltage generator as recited in claim 9, wherein the ring oscillator includes:
    a NOR gate configured to receive the detection signal and an output signal of a plurality of inverters and to perform a NOR logic operation; and
    the plurality of inverters connected in series configured to receive an output of the NOR gate and to perform an inverter logic operation.

11. A negative voltage generator of a semiconductor memory device, comprising:
    a temperature information providing unit configured to provide a plurality of flag signals that include temperature information of the semiconductor memory device, wherein the plurality of flag signals are generated by decoding a temperature information code; and
    a pumping unit configured to receive the plurality of flag signals including the temperature information of the semiconductor memory device and to generate a negative voltage having a different level depending on temperature of the semiconductor memory device in response to the plurality of flag signals including the temperature information,
    wherein the negative voltage is a lower voltage than a ground voltage,
    wherein the pumping unit comprises a negative voltage detection unit comprising:
        a first resistive block having resistance changing according to the ground voltage, wherein the first resistive block couples a first node to a core voltage of the semiconductor memory device; and
        a second resistive block having resistance changing according to the negative voltage, wherein the second resistive block couples the first node to the ground voltage.

12. The negative voltage generator recited in claim 11, wherein the pumping unit pumps the negative voltage having a lower level as the temperature of the semiconductor memory device increases.

13. The negative voltage generator recited in claim 12, wherein the temperature information providing unit includes:
    a bandgap unit configured to detect a temperature of the semiconductor memory device to output a first voltage;
    a tracking unit configured to receive and track the first voltage and to output a temperature information code containing temperature information of the semiconductor memory; and
    a flag signal generation unit configured to generate a plurality of flag signals by decoding the temperature information code.

14. The negative voltage generator recited in claim 13, wherein the pumping unit further includes:
    an oscillation unit configured to receive the detection signal and to output a periodic signal in response to the detection signal;
    a pump control unit configured to receive the periodic signal and to output a plurality of pump control signals in response to the periodic signal; and
    a charge pump unit configured to receive the plurality of pump control signals and to generate the negative voltage in response to the plurality of pump control signals.

15. The negative voltage generator as recited in claim 14, wherein the negative voltage detection unit detects the negative voltage using a divided voltage produced by dividing a voltage level of the first node with the first resistive block and the second resistive block, the resistance of the first resistive block or the second resistive block changing according to the plurality of flag signals.

16. The negative voltage generator as recited in claim 15, wherein the first resistive block comprises a plurality of serially-connected PMOS transistors each of which receives the ground voltage through a gate thereof, the plurality of PMOS transistors being opened or shorted in response to the plurality of flag signals.

17. The negative voltage generator as recited in claim 15, wherein the second resistive block comprises a PMOS transistor receiving the negative voltage through a gate thereof and coupling the first node to the ground voltage through a drain-source path thereof.

18. The negative voltage generator as recited in claim 15, wherein the negative voltage detection unit further comprises a plurality of inverters connected in series to the first node to output the detection signal.

19. The negative voltage generator as recited in claim 1, wherein the flag signal generation unit outputs the plurality of flag signals according to temperature of the semiconductor memory device in a way that the a number of the flag signals having a level of a core voltage increases as the temperature of the semiconductor memory device increases.

20. The negative voltage generator as recited in claim 11, wherein the plurality of flag signals are provided according to the temperature of the semiconductor memory device in a way that a number of the flag signals having a level of a core voltage increases as the temperature of the semiconductor memory device increases.

* * * * *